(12) United States Patent
Gross

(10) Patent No.: US 7,459,376 B2
(45) Date of Patent: Dec. 2, 2008

(54) DISSOCIATED FABRICATION OF PACKAGES AND CHIPS OF INTEGRATED CIRCUITS

(75) Inventor: Harald Gross, Dresden (DE)

(73) Assignee: Infineon Technologies AG, Munich (DE)

( * ) Notice: Subject to any disclaimer, the term of this patent is extended or adjusted under 35 U.S.C. 154(b) by 116 days.

(21) Appl. No.: 11/051,969

(22) Filed: Feb. 4, 2005

(65) Prior Publication Data

US 2006/0175701 A1  Aug. 10, 2006

(51) Int. Cl.
*H01L 21/00* (2006.01)

(52) U.S. Cl. .................. 438/461; 438/411; 438/611; 257/785; 257/E23.067

(58) Field of Classification Search .............. 438/411, 438/461, 611; 257/785, E23.067
See application file for complete search history.

(56) References Cited

U.S. PATENT DOCUMENTS

| | | | | |
|---|---|---|---|---|
| 4,096,348 A | * | 6/1978 | Robillard et al. | 174/559 |
| 4,725,924 A | * | 2/1988 | Juan | 361/751 |
| 5,616,520 A | * | 4/1997 | Nishiuma et al. | 438/125 |
| 5,753,857 A | * | 5/1998 | Choi | 257/434 |
| 5,885,892 A | * | 3/1999 | Kondo | 438/615 |
| 5,972,781 A | * | 10/1999 | Wegleiter et al. | 438/460 |
| 6,191,951 B1 | * | 2/2001 | Houdeau et al. | 361/737 |
| 6,208,019 B1 | * | 3/2001 | Tane et al. | 257/679 |
| 6,452,117 B2 | * | 9/2002 | Curcio et al. | 174/262 |
| 6,603,183 B1 | * | 8/2003 | Hoffman | 257/434 |
| 6,608,374 B1 | * | 8/2003 | Lin et al. | 257/690 |
| 6,876,072 B1 | * | 4/2005 | Wang et al. | 257/678 |
| 6,995,455 B2 | * | 2/2006 | Nemoto et al. | 257/621 |
| 7,029,829 B2 | * | 4/2006 | Stark et al. | 430/320 |
| 7,115,989 B2 | * | 10/2006 | Hosokawa | 257/729 |
| 2003/0015803 A1 | | 1/2003 | Prietzch | |
| 2004/0113256 A1 | | 6/2004 | Thomas et al. | |

FOREIGN PATENT DOCUMENTS

DE    102 51 530 A1    5/2004

* cited by examiner

*Primary Examiner*—Wai-Sing Louie
*Assistant Examiner*—John C Ingham
(74) *Attorney, Agent, or Firm*—Slater & Matsil, L.L.P.

(57) ABSTRACT

A method of fabricating a semiconductor component includes providing a prefabricated frame that includes metal traces and lead-through contacts. A semiconductor chip is mounted into the prefabricated frame such that the semiconductor chip is embedded within a rim of the prefabricated frame. Contact regions on a surface of the semiconductor chip are electrically connected with the metal traces of the prefabricated frame such that the contact regions are electrically coupled to the lead-through contacts via the metal traces.

10 Claims, 10 Drawing Sheets

Cross section of trace with 6μm lines/spaces:

Top View in 4μm depth:

Heated cantilever with ultrasound source

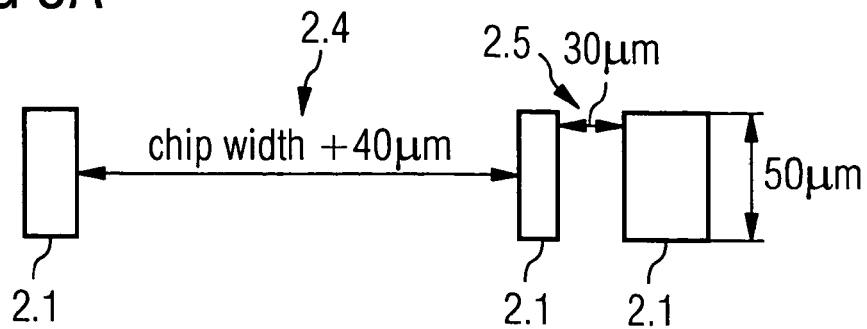
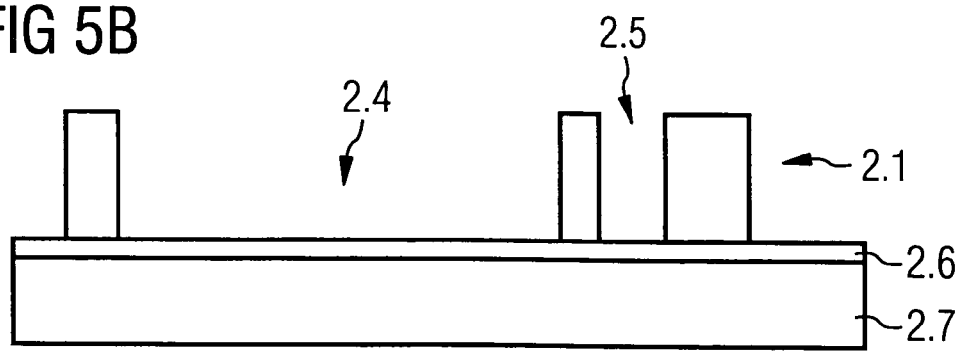
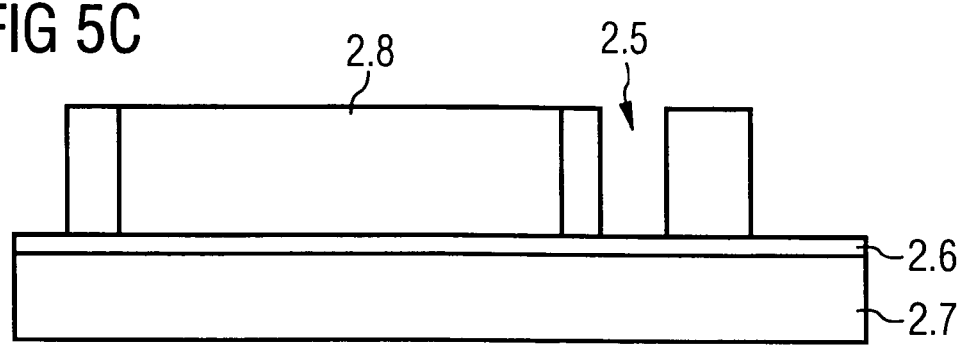
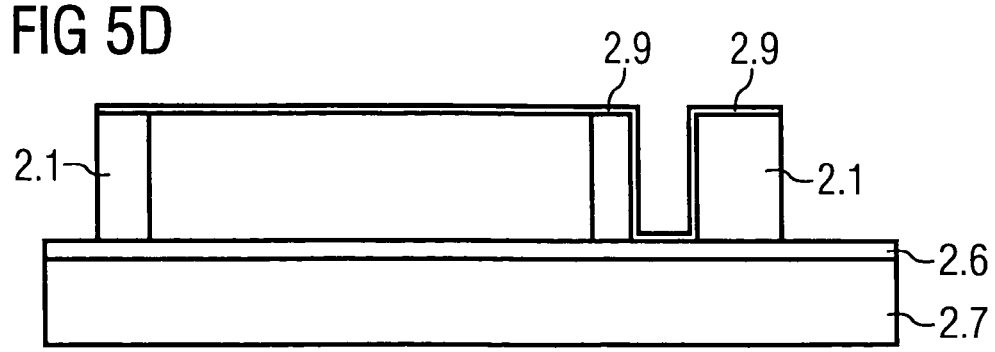

Heated cantilever with ultrasound source

Heated cantilever with ultrasound source 2.17

2.17

2.18

US 7,459,376 B2

DISSOCIATED FABRICATION OF PACKAGES AND CHIPS OF INTEGRATED CIRCUITS

TECHNICAL FIELD

The invention is concerned with a dissociated fabrication and final package of chips of integrated circuits with so called "redistribution layers" or metal traces.

BACKGROUND

It is well known for one skilled in the art that the fabrication of integrated circuits requires many fabrication steps, starting with structuring a silicon chip for the desired electrical function, e.g., a memory chip or a processor. This process covers deposition steps, photolithography steps, etching steps and other fabrication steps until the desired function is performed. After that, the integrated circuit is finally mounted on a substrate, such as a printed circuit board, and the electrical interconnections between the circuit and the board are carried out at the same time.

This electrical interconnection is often established by wiring or wire bonding. In a final step, the integrated circuit must be provided with a housing, which can be formed by molding a suitable mold compound around the chip so that the sensitive chip is protected against mechanical damage.

Most memory chips must not be exposed to temperatures above 200° C. because of so called retention failures. The result is that the applicable processing technologies and materials for packaging are limited significantly.

An example of a multichip module with stacked semiconductor chips is described in the U.S. patent application publication 2003/0015803 A1, which is incorporated herein by reference. In this publication bond pads on the rim of the chip are connected with bonding pads on a board with bond wires. Another example is described in the German patent publication 102 51 530 A1 and U.S. Patent application publication 2004/0113256 A1, which are incorporated herein by reference. In a stacked memory device, two semiconductor chips are stacked and are each provided with central rows of bond pads and redistribution layers on the top surface of each chip with inner landing pads. The inner landing pads are connected with the bond pads by wire bonding. The redistribution layers are also provided with landing pads on the rim of the chip, each being connected with contact pads at the board by wire bonding. The complete staple is molded with a mold compound so that the two bare chips and the wire loops are enclosed in this encapsulation.

Typically the fabrication of the package is performed before embedding the chip inside the package. Afterwards electrical interconnection of the chip and package by the wire bonding process as described above is followed by overmolding. Such steps are process steps at low temperatures without any influence on the thermal budget.

However, future and some currently available memory products, especially stacked chips require a different packaging method to meet desired performance, cost and reliability. Recent product generations and all known development paths for future products employ packages which are partially fabricated together with the chip. For example, so called "redistribution layers" as mentioned above are electroplated on the surface of a chip. In some cases even the package is completely "built" around the chip. As mentioned before the applicable processing methods are then limited to temperatures below 200° C.

SUMMARY OF THE INVENTION

In one aspect, the present invention is directed to decrease the temperature load on fabrication of semiconductor chips by dissociated fabrication of packages and chips. Most parts of the package are fabricated separately from the chip. This allows a higher freedom for processing temperatures and materials regarding package fabrication.

According one aspect of the invention, a multichip module is realized by stacking prefabricated semiconductor modules and then molding the stacked chips.

Each prefabricated semiconductor module includes a semiconductor chip mounted in a completely prefabricated frame provided with metal strips connecting the bond pads on the chip arranged in a central row on the top surface of the chip. The other end of the metal strips is connected with lead through connections in the frame. Such a frame can be a molded frame. The bond connects between the central bond pads and the metal strips can be realized by ultrasonic compression batch bonding.

Another aspect of the invention is to minimize the thermal induced mechanical stress of the package. For that, the semiconductor chips in the frame have no fast contact with the inside of the frame and are held only by the bond contacts of the metal strips with the bond pads on the chip. Since the chips have many degrees of freedom, thermal expansion of the chip will not lead to any mechanical stress.

BRIEF DESCRIPTION OF THE DRAWINGS

For a more complete understanding of the present invention, and the advantages thereof, reference is now made to the following descriptions taken in conjunction with the accompanying drawings, in which:

FIGS. 5A-5H illustrate prefabrication of a frame assembled with metal traces and lead through contacts;

DETAILED DESCRIPTION OF ILLUSTRATIVE EMBODIMENTS

The dissociated fabrication and final package of chips of integrated circuits describes completely prefabricated semiconductor chips surrounded by a frame and held in it by electrical and mechanical connections between bond pads on the chip in a central row arrangement and metal traces on the frame terminate in a semiconductor module. This semiconductor module can be stacked in a stacked arrangement.

To realize such semiconductor modules and stacked arrangement of them with a dissociated fabrication of the components will be described hereinafter.

A first example will describe a simplified process for fabricating the necessary components of a semiconductor module and finally a stacked arrangement of such modules.

Figure 1A:
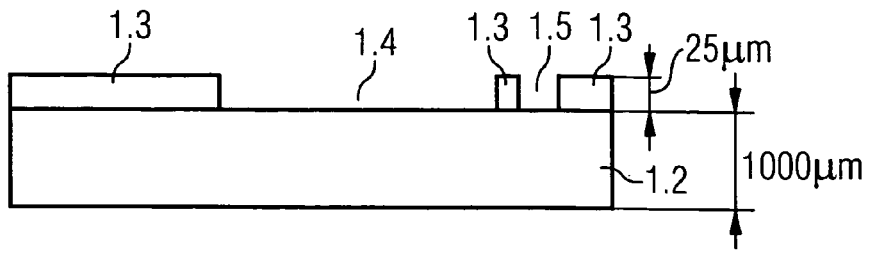
FIGS. 1A-1H illustrate the prefabrication of metal traces on a glass wafer.
Figure 1B:
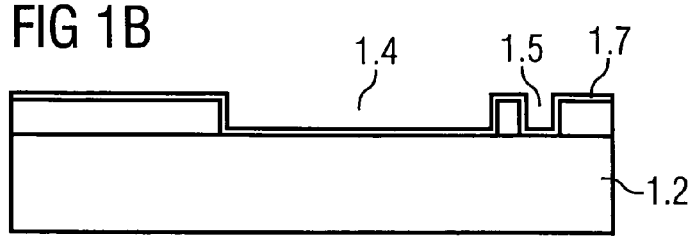
Figure 1G:
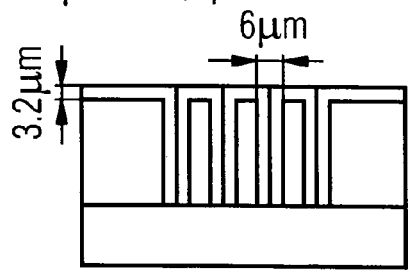
Figure 1C:
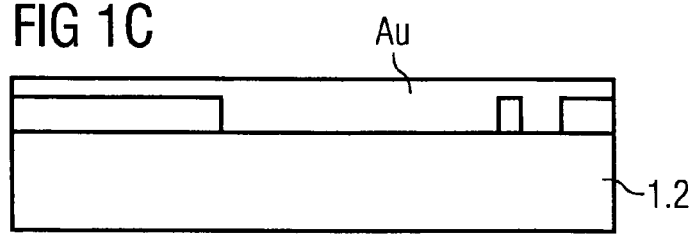
Figure 1D:
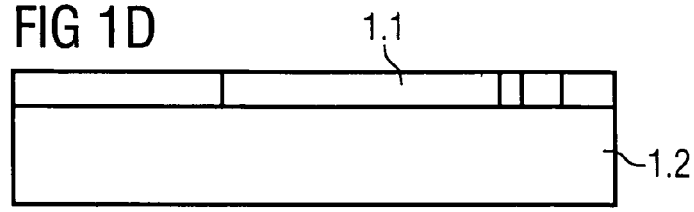
Figure 1H:
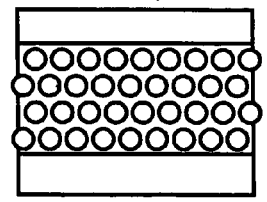

FIGS. 1A to 1F depict a first level processing to realize metal traces 1.1, shown is a schematic cross section (see e.g., FIG. 1D). In the preferred embodiment, a number of metal traces 1.1 are arranged side by side with a lateral distance of e.g., 6 µm as depicted in FIG. 1G. FIG. 1H shows a top view of the final structure, in this case in an 8 µm depth.

FIG. 1A shows a glass wafer 1.2 with a resist layer 1.3 disposed on its surface. The resist layer 1.3 is structured by a lithography with a recess 1.4 for the later processed metal trace 1.1 and a via 1.5 for a later contact 1.6 (see e.g., FIG. 1F for metal trace 1.1 and contact 1.6). In the specific illustrated example, the thickness of the photolithography processed photoresist layer 1.3 is about 25 µm and the glass wafer 1.2 is about 1000 µm. In other embodiments, different thicknesses can be used.

The next step is sputtering a seed layer 1.7 of Cr/Au as seen from FIG. 1B. In other embodiments, other materials can be used. For example, the seed layer 1.7 can be TaN/Cu, if the metal trace 1.1 is made from Cu.

FIG. 1C illustrates the electroplating of Au. In the particular illustrated embodiment, the Au layer has a thickness of 3.2 µm. A high temperature hardbake can be performed to improve subsequent lapping results in the following lapping step. The results of the lapping step are shown in FIG. 1D, other planarization changes could alternatively be used. For example, the layer 1.1 can be formed by chemical mechanical polish or by etch back.

Figure 1E:
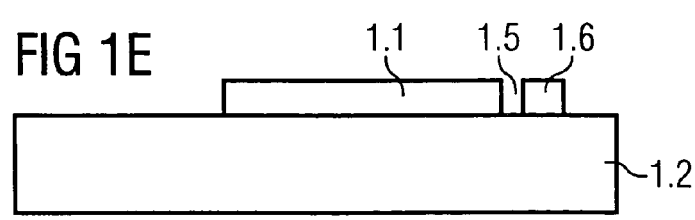

Referring to FIG. 1E, the next step is stripping photo resist 1.3 and Cr seed layer 1.7. At this point, the metal traces 1.4 and the contact 1.6 remain on the glass wafer 1.2. The last illustrated step is stencil printing of an epoxy resin with the result shown in FIG. 1F.

The sequence of FIGS. 2A to 2F illustrates the manufacturing of frame 1.8 with epoxy and filler material at wafer scale.

Figure 2A:
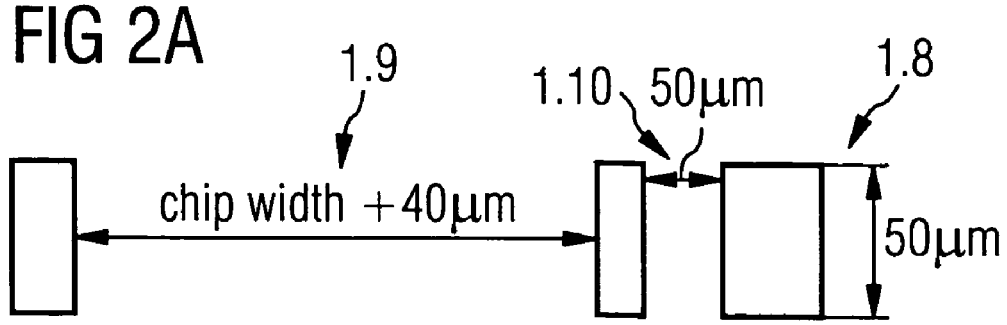
FIGS. 2A-2F illustrate the processing of a frame and assembling it with the metal trace according to FIG. 1F.
Figure 2B:
Figure 2C:

FIG. 2A illustrates a separate manufactured frame 1.8, which in this cross sectional view appears as three separate pieces. The frame 1.8 includes an opening 1.9 and a bore 1.10, e.g., with a thickness of 50 µm. Then a Cr/Au adhesion layer 1.11 is deposited through a shadow mask in the bore 1.10 as shown in FIG. 2B. FIG. 2C shows a microinjection molding of solder 1.12.

Figure 1F:
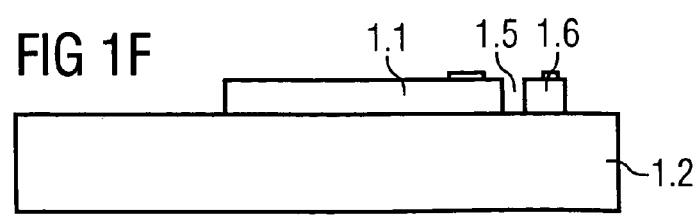
Figure 2D:
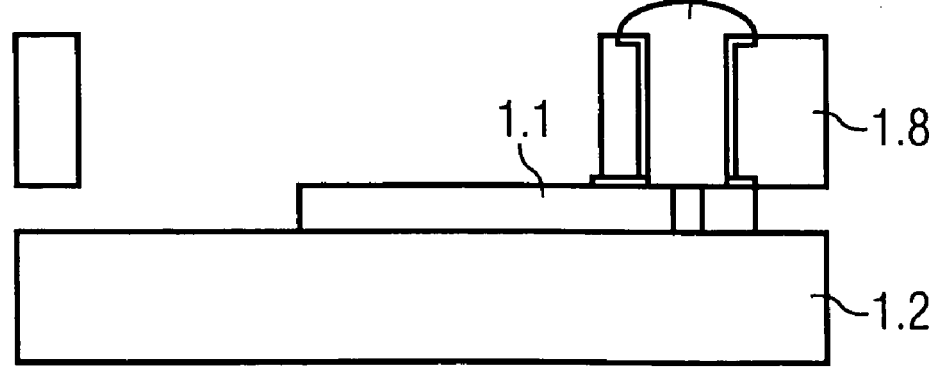
Figure 2E:
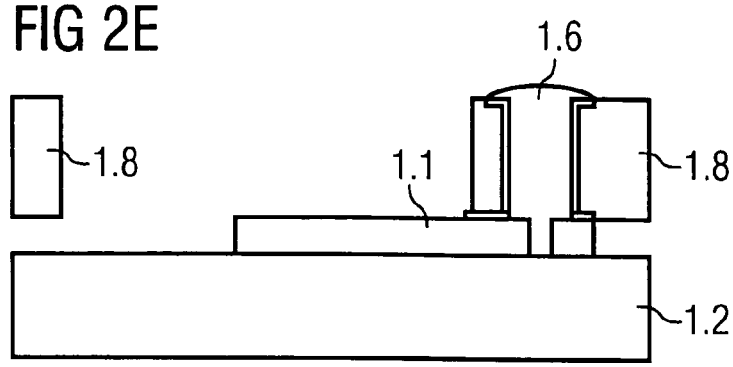

Then the structure of FIG. 2C is positioned and aligned at the structure with the metal trace 1.1 on the glass wafer 1.2 shown in FIG. 1F. The combination is shown in FIG. 2D. Then a reflow process of solder 1.12 with the result that the solder volume at the top is slightly reduced and the bore 1.10 is filled with solder as shown in FIG. 2E.

Figure 2F:
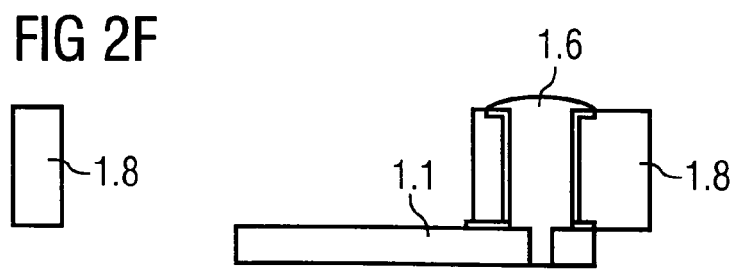

The last step of prefabrication of the frame 1.8 with the accompanying metal traces 1.1 is shown in FIG. 2F with removing the glass wafer 1.2 from the frame 1.8, e.g., by undercut with HF-energy.

FIGS. 3A to 3F depict final processing of a prefabricated semiconductor module 1.13.

Figure 3A:
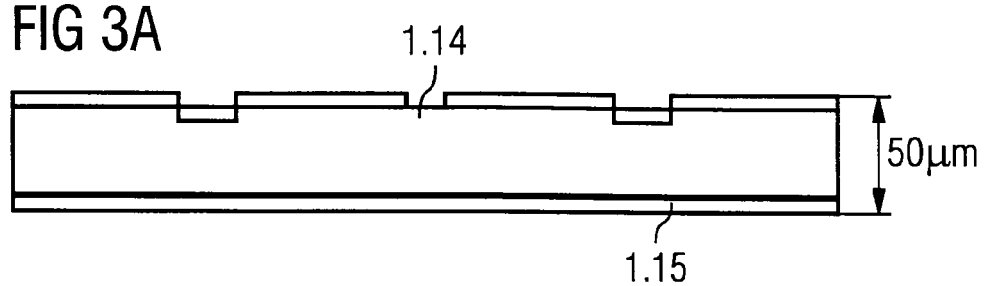
FIGS. 3A-3F illustrate dicing a front end wafer and assembling it with the prefabricated structure according to FIG. 2F to a semiconductor module.
Figure 3B:
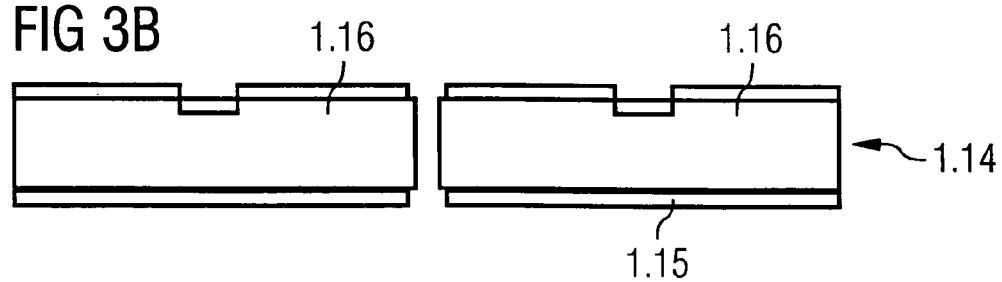
Figure 3C:
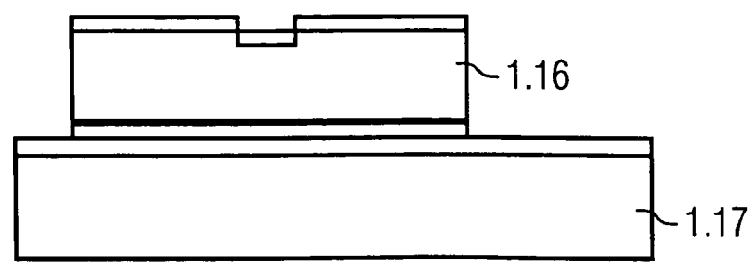

FIG. 3A schematically shows a grinded front-end wafer 1.14, e.g., with a thickness of about 50 µm and provided with an adhesive tape 1.15 laminated on its backside. As shown in FIG. 3B, the wafer 1.14 is diced into chips 1.16 from its backside on tape at its front side. The chips 1.16 are then picked up and placed on a glass wafer 1.17 side by side with a UV-release adhesive as shown in FIG. 3C.

Figure 3D:
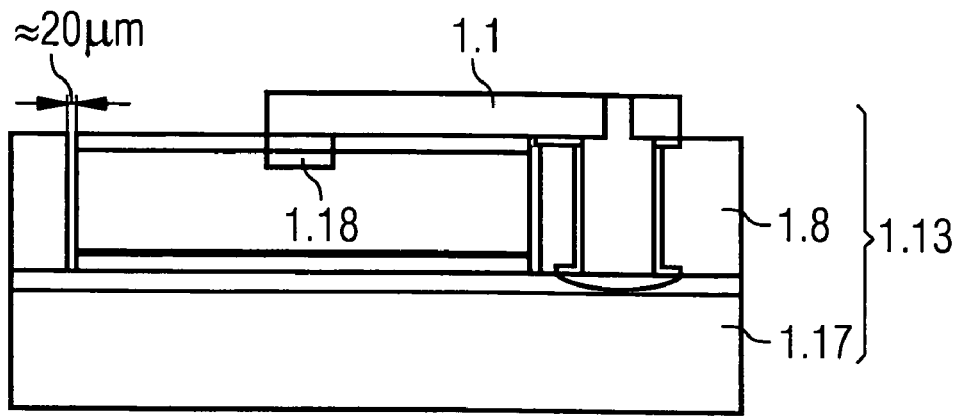
Figure 3E:
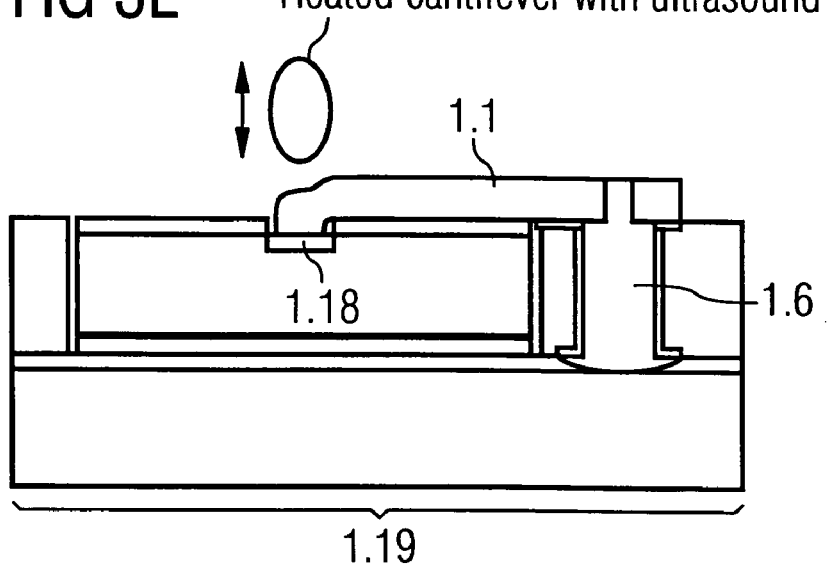

In a next step, the prefabricated structure according FIG. 2F is turned over the chips 1.16 so that the molded frame 1.8 is assembled into the semiconductor module 1.13 as shown in FIG. 3D. The metal trace 1.1 is connected to the bond pads 1.18 by ultrasonic compression batch bonding with a heated cantilever with ultrasonic source as shown in FIG. 3E.

Figure 3F:
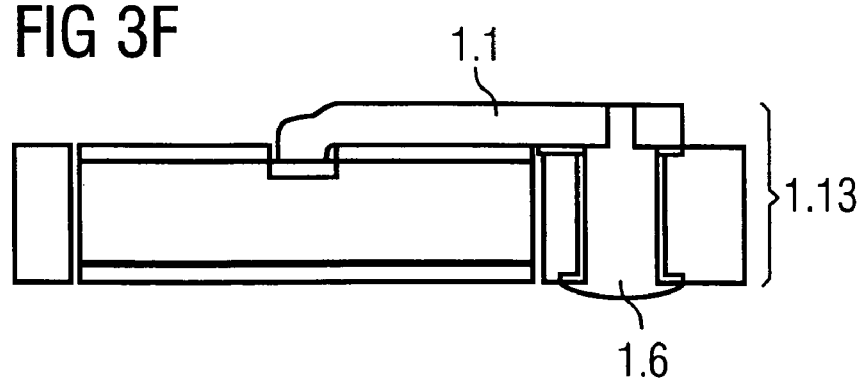

Then the structure is exposed to UV-light, to release tape 1.15 and glass wafer 1.17 as shown in FIG. 3F. The frame structure can then be diced into single dies followed by testing and Burn-In of single dies, i.e., the prefabricated semiconductor modules 1.13.

Figure 4A:
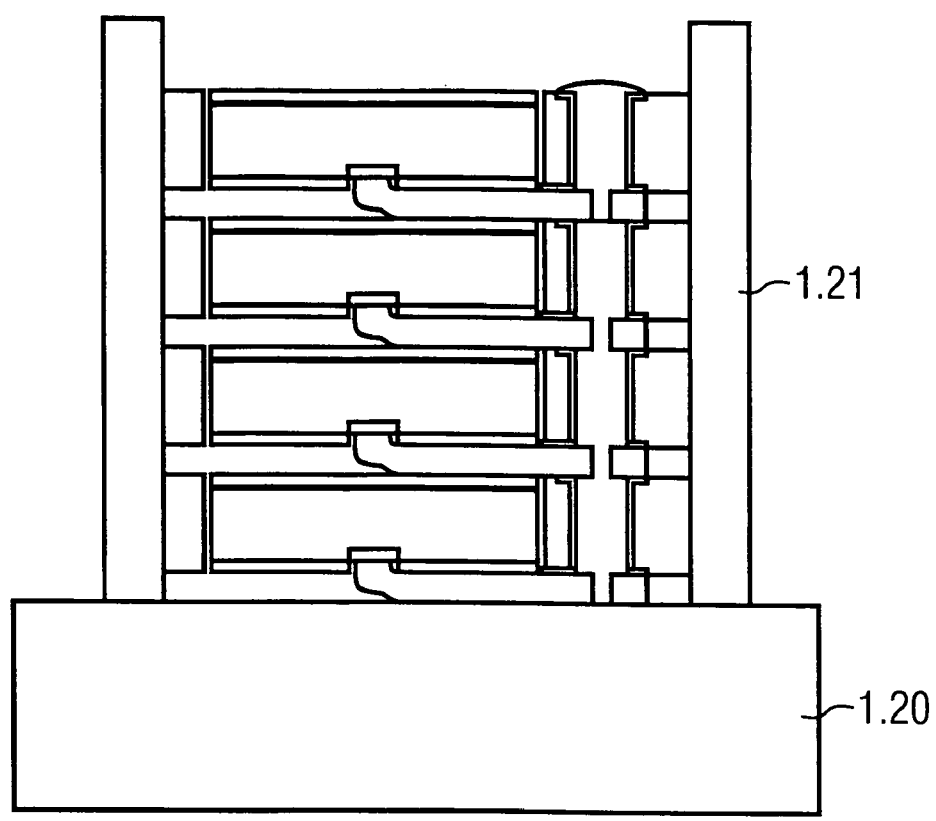
FIGS. 4A and 4B depict stacking and alignment of semiconductor modules according to FIG. 3F and an overmolded structure.
Figure 4B:
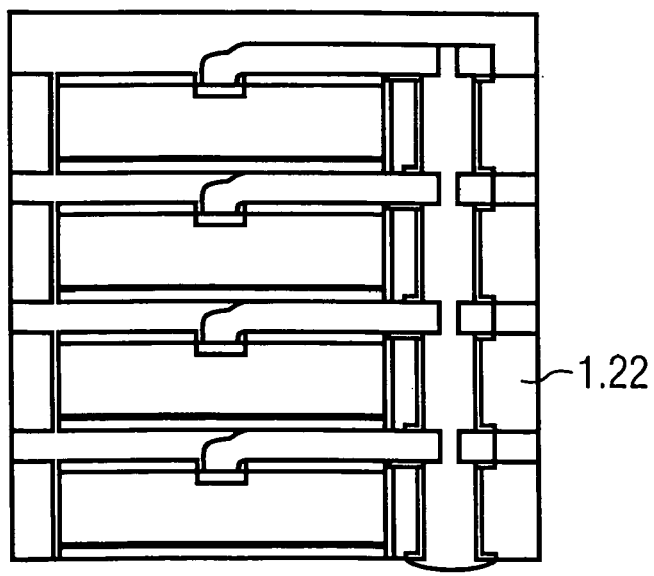

FIGS. 4A-4B illustrate how these prefabricated semiconductor modules 1.13 can be stacked in a stacked structure. To realize this, a hotplate 1.20 together with a mechanical jig 1.21 on its surface are positioned as alignment support for stacking the modules 1.13 as shown in FIG. 4A. FIG. 4B depicts a finished module stack, which is overmolded with a mold compound 1.22 with subsequent curing.

Figure 5E:
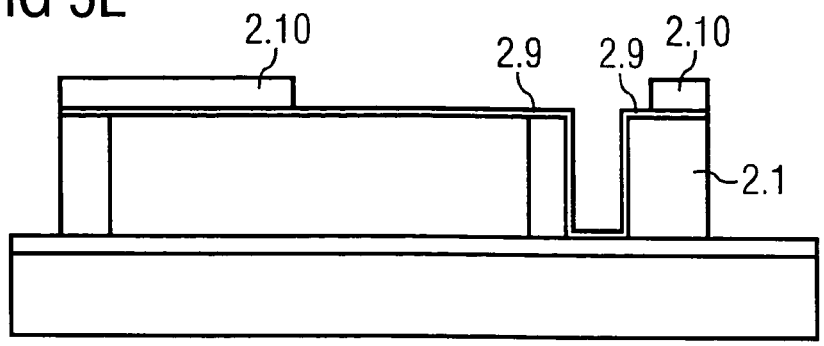

A second example will be described hereinafter. FIGS. 5A-5H illustrate the prefabrication of a frame 2.1 together with metal leads 2.2 and lead through contacts 2.3, the final structure being shown in FIG. 5H. The first step is prefabrication of a chip frame array with epoxy and filler material. FIG. 5A shows such a frame 2.1, with dimension information for a specific example. The frame is provided with an opening 2.4 with dimensions like a chip and a bore 2.5 for the lead through contact 2.3. Then the prefabricated frames 2.1 are mounted side by side with a thermo-release adhesive 2.6 onto a wafer carrier 2.7 as shown in FIG. 5B.

FIG. 5C a screen printing of a stippable polymer 2.8 so that the opening 2.4 is completely filled. This step should be performed so that the bore 2.5 remains unfilled. That means that the bore 2.5 is preferably covered by a mask (not shown) during screen printing of the polymer 2.8.

A seed layer 2.9 of Ti/Au is then deposited at the surface of the structure as shown in FIG. 5D. As shown in FIG. 5E, a lithography step of an electrophoresis resist to realize a photoresist mask 2.10 follows.

Figure 5F:
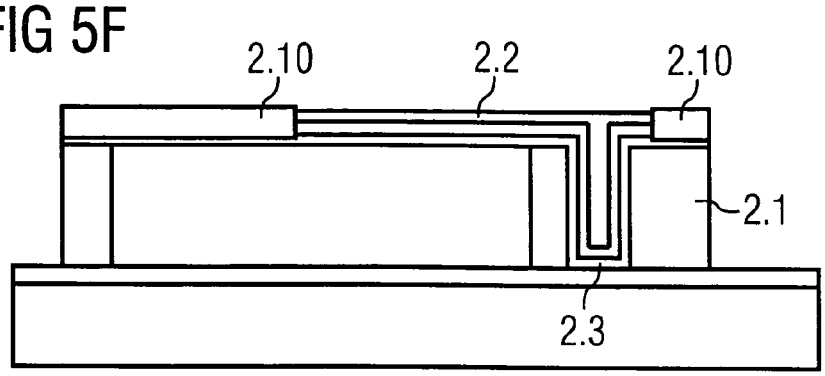
Figure 5G:
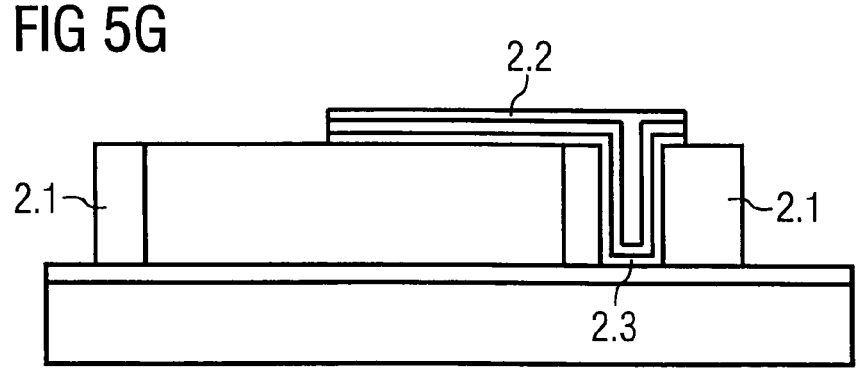

The prefabrication of the metal lead 2.2 and the lead through contact 2.3 is performed by electroplating a first layer of 3 µm Au, a second layer of 9 µm Ni for mechanical stability and a third layer of 3 µm Au as shown in FIG. 5F. These particular thicknesses are exemplary only. The two Au layers are for soldering, signal connection at high frequencies (skin effect) and protection.

Figure 5H:
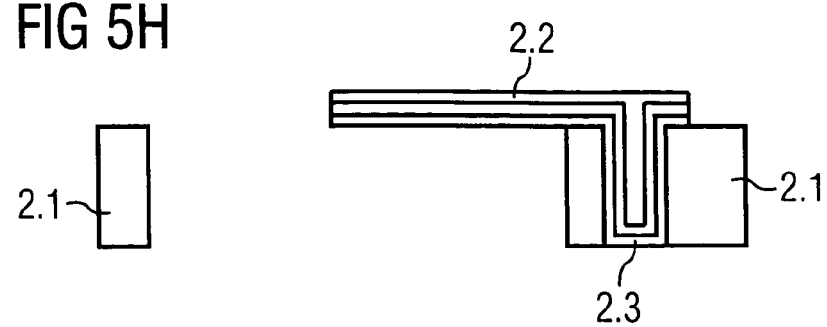

The final steps are stripping of electrophoresis resist (FIG. 5G) and stripping of carrier 2.7 and strippable polymer 2.8 (FIG. 5H).

Figure 6A:
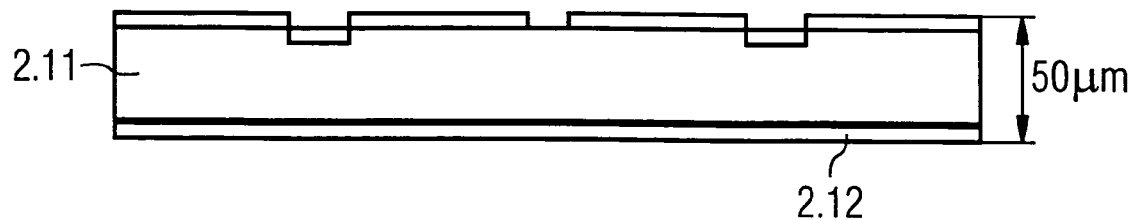
FIGS. 6A-6G illustrate dicing a front end wafer and assembling it with the prefabricated structure according to FIG. 5H to a semiconductor module.
Figure 6B:
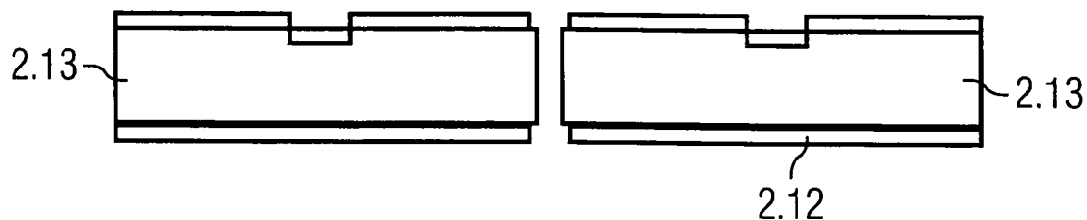
Figure 6C:
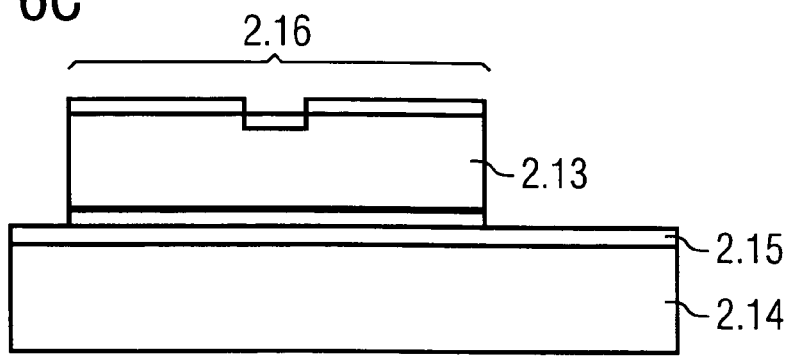

In parallel processing according to FIGS. 6A-6G, a grinded front-end wafer 2.11 (e.g., with a thickness of about 50 µm) is provided with an adhesive tape 2.12 laminated on its backside as shown in FIG. 6A. Then the wafer 2.11 is diced into chips 2.13 from the backside as shown in FIG. 6B. The chips 1.16 then are picked up and placed on a carrier 2.14 side by side with a thermo-release adhesive 2.15. The carrier can be a glass wafer bonded at the chip 2.16 with a UV-release adhesive. This step is shown in FIG. 6C.

Figure 6D:
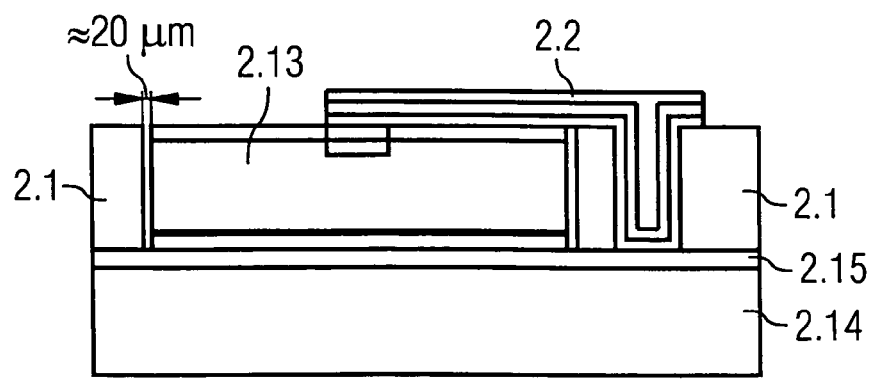
Figure 6E:
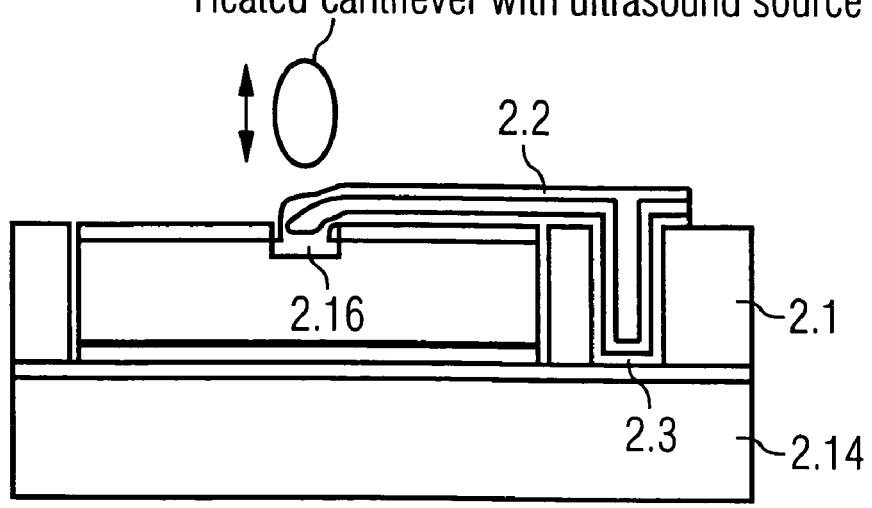

As shown in FIG. 6D, the structure from FIG. 5H is then assembled so that the chip 2.13 is surrounded by the frame 2.1. The final steps are connecting the metal lead 2.1 with the bond pads 2.16 on the chip 2.13 by ultrasonic compression batch bonding with a heated cantilever with an ultrasonic source as shown in FIG. 6E. Alternatives are laser heating to support compression bond or laser welding.

Figure 6F:
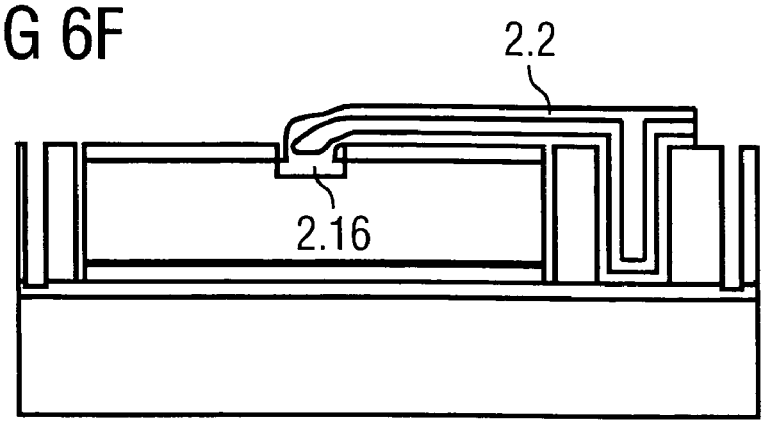

Then the frame structure is diced into single dies, as shown in FIG. 6F, followed by testing and Burn-In of single dies. The chip 2.13 can be glued into frame 2.1 before dicing as a mechanical support.

Figure 6G:
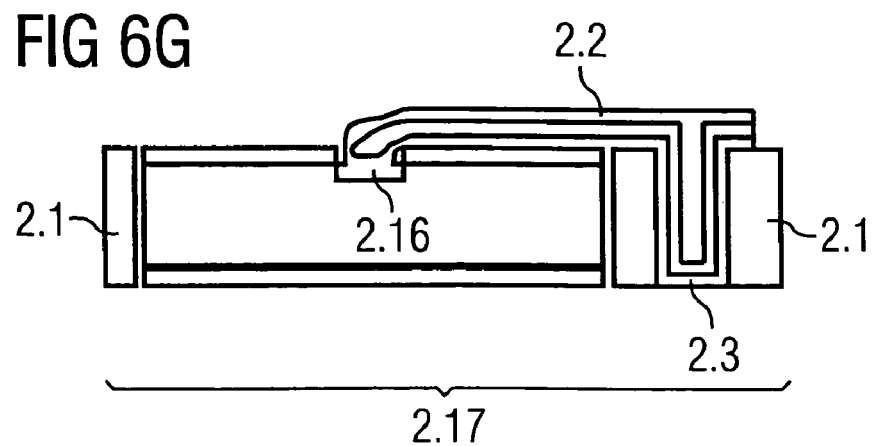

The prefabricated semiconductor module 2.17 is shown in FIG. 6G. The carrier 2.14 is stripped by heating in the case of the thermo release tape or by exposing with an UV-light in the case of UV-release tape.

Figure 7A:
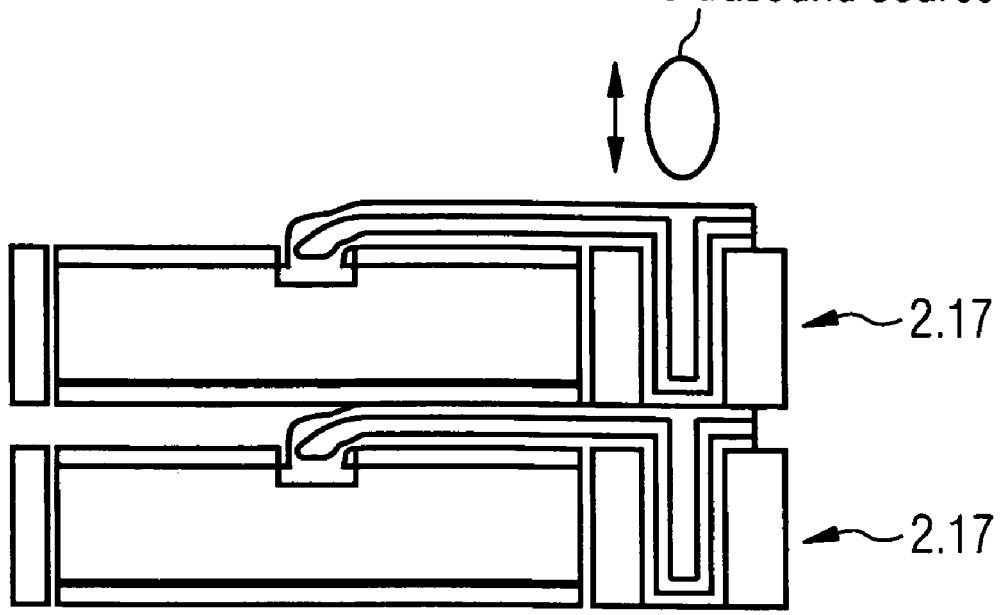
FIGS. 7A and 7B depict stacking and alignment of semiconductor modules according to FIG. 6G and an overmolded structure.
Figure 7B:
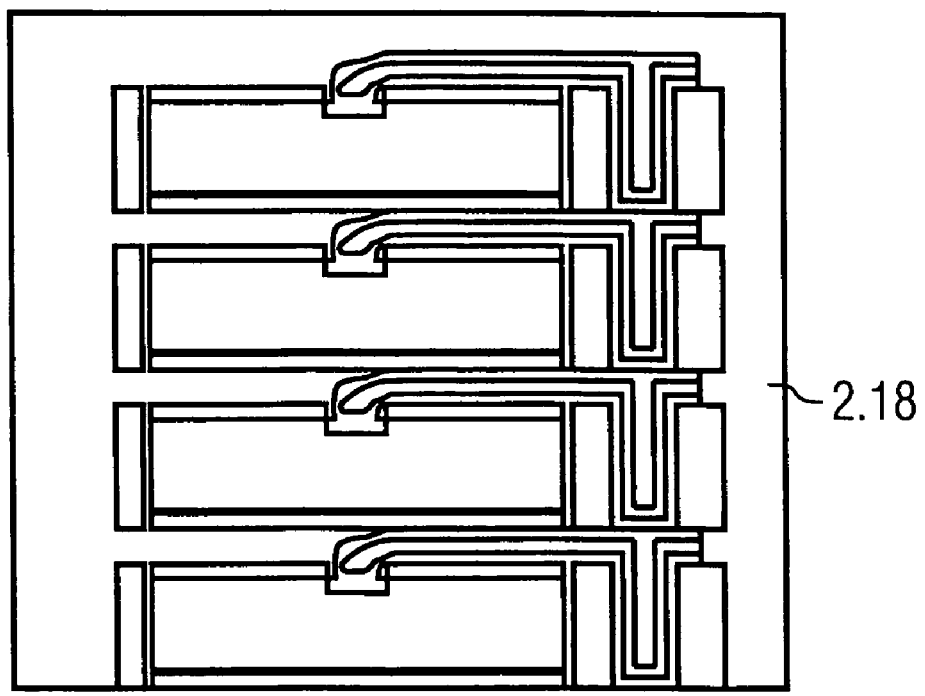

This prefabricated module 2.17 can be stacked on a stacked structure according FIG. 7A. To contact the metal leads 2.2 with the bond pads 2.16 ultrasonic compression batch bonding is performed. The interconnection of the lead through contacts 2.3 is realized with a heated cantilever connected with an ultrasonic source. FIG. 7B depicts an overmolded and cured stack of modules 2.17. Overmolding is performed with a mold compound 2.18.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating a semiconductor component, the method comprising:
   forming a trace attached to a substrate and made solely of conductive metal, said conductive metal trace having a first end and a second end;
   providing a frame structure having a rim at least partially defining a first recess for receiving a semiconductor circuit and a bore;
   filling the bore with a solder material to form a lead-through contact;
   positioning said bore of said frame structure filled with said solder material to contact said first end of said metal trace on the substrate;
   reflowing said solder material filling the bore to attach the first end of the metal trace to the frame structure;
   detaching the metal trace from the substrate such that the first end of the metal trace is supported by the rim of the frame structure and the reflowed solder material in said lead-through contact so that the second end of the metal trace is cantilevered over said recess;
   adhering a semiconductor chip to a dummy substrate;
   positioning the semiconductor chip within the first recess of the frame structure such that said semiconductor chip is embedded within said rim of the frame structure;
   attaching the semiconductor chip to the rim of the frame structure;
   removing the dummy substrate from the semiconductor chip; and
   physically connecting a contact region on a surface of the semiconductor chip directly to the cantilevered second end of said metal trace of the frame structure such that the contact region is electrically coupled to the lead-through contact via the metal trace.

2. The method of claim 1 wherein positioning the semiconductor chip within the first recess of the frame structures comprises placing the frame over the semiconductor chip while the semiconductor chip is substantially stationary.

3. The method of claim 1 and further comprising assembling a second semiconductor component that is substantially identical in structure to the semiconductor component, the method further comprising attaching the second semiconductor component to the semiconductor component.

4. The method of claim 3, wherein attaching the second semiconductor component to the semiconductor component comprises aligning the semiconductor component and the second semiconductor component in a mechanical jig.

5. The method of claim 3 and further comprising forming a molding compound over the semiconductor component and the second semiconductor component.

6. The method of claim 1, wherein the contact region is electrically connected with the cantilevered second end of the metal trace by heat and ultrasonic energy.

7. The method of claim 1, wherein the contact region is electrically connected with the cantilevered second end of the metal trace by ultrasonic compression batch bonding.

8. The method of claim 1 wherein forming the trace attached to the substrate comprises:
   forming a sacrificial layer over the substrate;
   patterning the sacrificial layer;
   depositing a seed layer over the patterned sacrificial layer;
   forming metal over the seed layer;
   planarizing the metal to expose the patterned sacrificial layer; and
   removing the patterned sacrificial layer.

9. The method of claim 8 wherein forming the metal over the seed layer comprises electroplating gold.

10. The method of claim 1 wherein filling the bore with the solder material comprises microinjecting solder into the bore.

* * * * *